United States Patent [19]

Inuishi

[11] Patent Number: 4,918,500
[45] Date of Patent: Apr. 17, 1990

[54] SEMICONDUCTOR DEVICE HAVING TRENCH CAPACITOR AND MANUFACTURING METHOD THEREFOR

[75] Inventor: Masahide Inuishi, Hyogo, Japan

[73] Assignee: Mitsubishi Denki Kabushiki Kaisha, Tokyo, Japan

[21] Appl. No.: 211,931

[22] Filed: Jun. 27, 1988

[30] Foreign Application Priority Data

Jun. 29, 1987 [JP] Japan ................... 62-161663

[51] Int. Cl.[4] ............ H01L 29/78; H01L 29/06; H01L 27/02
[52] U.S. Cl. ........................ 357/23.6; 357/55; 357/41
[58] Field of Search ............................ 357/23.6

[56] References Cited

U.S. PATENT DOCUMENTS 4,786,954 11/1988 Morie et al. ................ 357/55

FOREIGN PATENT DOCUMENTS 853260 1/1983 Japan .

OTHER PUBLICATIONS

M. Taguchi et al., "Dielectrically Encapsulated Trench Capacitor Cell", IEDM 86, (1986).
S. Nakajima et al., "An Isolation-Merged Vertical Capacitor Cell for Large Capacity Dram", IEDM 84 (1984).
P. Chatterjee et al., "Trench and Compact Structures for dRAMS", International Electron Device Meeting (1986).

Primary Examiner—Rolf Hille
Assistant Examiner—Robert P. Limanek
Attorney, Agent, or Firm—Lowe, Price, LeBlanc, Becker & Shur

[57] ABSTRACT

A semiconductor memory device comprises a semiconductor substrate having a trench, first polysilicon serving as a charge storage region formed through an insulating film in an inner portion of the trench, and second polysilicon serving as a capacitor electrode formed through an insulating film inside of the first polysilicon, the charge storage regions being connected to a transfer gate in the upper end of the concave portion so that information charges are transferred.

6 Claims, 12 Drawing Sheets

SEMICONDUCTOR DEVICE HAVING TRENCH CAPACITOR AND MANUFACTURING METHOD THEREFOR

BACKGROUND OF THE INVENTION

1. Field of the Invention

The invention relates generally to semiconductor devices having trench type capacitors, and more particularly, to a high integration density trench-type capacitor structure for semiconductor devices and a manufacturing method therefor. The invention has particular applicability to high density dynamic random access memory integrated circuits.

2. Description of the Prior Art

A dynamic semiconductor memory device has been already well known. FIG. 1 is a block diagram showing an entire structure of such a conventional dynamic semiconductor memory device.

In FIG. 1, the dynamic semiconductor memory device comprises an array including a plurality of memory cells each serving as a memory portion, a row decoder and a column decoder for selecting addresses thereof, and an input/output interface portion including sense amplifiers connected to an input/output buffer. The plurality of memory cells are connected to intersections of word lines connected to the row decoder and bit lines connected to the column decoder, respectively, the word lines and the bit lines constituting a matrix. In the above described manner, the above described array is structured.

Operation is now described. A memory cell connected to an intersection of each of the word lines and each of the bit lines selected by the row decoder and the column decoder in response to a row address signal and a column address signal externally applied. Information is read out or written from or to the memory cell through the input/output interface portion including the sense amplifiers and the input/output buffer.

Each bit line is connected to the sense amplifier, an amplifier of a flip-flop type, and a signal fed out from the memory cell is amplified by this amplifier. As a level of the fed out signal is very low, a high sensitive amplifier is required.

FIG. 2 is a schematic diagram showing a periphery of the sense amplifier. The sense amplifier compares an output signal from the memory cell with a prescribed reference voltage and amplifies the difference between them. Bit lines are connected to either side of the sense amplifier. One bit line is connected to memory cells, the other is connected to dummy cells. A read out signal from the dummy cell is used as a reference voltage. Each one dummy cell is coupled to either side of the sense amplifier. Output voltage from the dummy cell is set to be a midway value between a high level signal and a low level signal fed from the memory cell. In order to enable above, storage capacitor of the dummy cell is made to be a half of that of the memory cell. In order to amplify the output signal from the memory cell efficiently, each bit line is charged to a certain precharge level $V_P$ (usually corresponding to a supply voltage or one half of the supply voltage) while data is kept in the memory cell.

FIG. 3 is an equivalent circuit explaining a voltage difference to be sensed by the sense amplifier. In the drawing, $C_B$ is a capacitance value of the bit line and $C_S$ is a capacitance value of one memory capacitor. $T_R$ is a select gate transistor to select a memory cell located at the junction of the selected bit line and the selected word line.

A read out operation when the memory capacitor is kept at high level is as follows. A voltage of the bit line is set to be a precharge level. Before the select gate transistor is turned on, the charge on the memory cell capacitor is $C_S \cdot V_H$, and the charge on the bit line capacitor is $C_B \cdot V_P$. Where, $V_H$ is high level voltage. And $V_P$ is a precharge level voltage. As a total charge stored is reserved, the charge after the select gate transistor is turned on is as follows.

$$Q = (C_B + C_S) \cdot V_{P'} = C_S \cdot V_H + C_B \cdot V_P \quad (1)$$

where $V_{P'}$, is a new level satisfying an equation (1)

$$\Delta V_H = V_{P'} - V_P = \frac{C_S}{C_B + C_S} (V_H - V_P) \quad (2)$$

As shown in equation (2), a voltage of the bit line changes by $\Delta V_H$. The sense amplifier detects the voltage difference $\Delta V_H$.

Same is true in the case that the memory cell is kept at low level.

$$\Delta V_L = V_{P'} - V_P = \frac{C_S}{C_B + C_S} (V_L - V_P) \quad (3)$$

In this case, a voltage of the bit line changes by $\Delta V_L$ and the sense amplifier detects the voltage difference $\Delta V_L$.

On the other hand, before the read out operation, a voltage of the dummy cell is always kept at low level $V_L$ and a bit line connected to the dummy cell is kept at a precharge level. Therefore, when the select gate transistor is turned on, a voltage of the bit line is lowered by $\Delta V_D$, a voltage difference satisfying an equation (4), from the precharge level $V_P$.

$$\Delta V_D = V_{P'} - V_P = \frac{C_D}{C_B + C_S} (V_L - V_P) \quad (4)$$

where $C_D$ is a capacitance value of the dummy cell.

FIG. 4 is a schematic diagram showing the relationship between high level, low level and prescribed midway value of the dummy cell.

When a certain memory cell and a corresponding dummy cell is selected, a voltage of a bit line changes from a precharge voltage $V_P$ depending on a magnitude of a read out signal from the memory cell and the dummy cell. A difference between the precharge voltage $V_P$ and the voltage after the select gate transistor is turned on is fed to the sense amplifier to work.

A minor signal read out from the memory cell to the bit line is amplified by the sense amplifier. As an output terminal is used as an input terminal as well, amplified signal is rewritten to the read out memory cell via the bit line automatically. Therefore, when a data signal is read out from a certain memory cell, the data is automatically rewritten in the same memory cell. A dynamic RAM keeps information charges by storing charges on the capacitors. If the data signal is not rewritten periodically, the data will be dissipated. The sense amplifier keeps on rewriting the data to the memory cells and prevents the data from dissipating by above described function. The function is called "refreshing".

As to the detail operation of the dynamic RAM, U.S. Pat. No. 3,940,747, entitled "High Density, High Speed Random Access Read-Write Memory" can be referred to Conventionally, two kinds of semiconductor memory devices have been known as a dynamic semiconductor memory device of a trench type for high integration density of more than 4M bits, which is described by Chatterjee et al. in IEDM (International Electron Device Meeting) Technical Digest.

The two kinds of dynamic semiconductor memory devices comprise a type in which charges are stored on the side of a semiconductor substrate in a capacitor cell portion and a type in which charges are stored in a semiconductor layer formed on the semiconductor substrate through an insulating film.

FIG. 5 is a cross sectional view showing main portions of the former type. Referring to FIG. 5, a trench 2 which is a concave portion is formed in a $P^-$ type semiconductor substrate 1. An $N^+$ type charge storage region 3 in which charges are to be stored for storing information is formed on the surface of the trench 2. A first insulating layer 4 is formed on the inner peripheral surface of the trench 2 and a part of the upper surface of the semiconductor substrate 1. A capacitor electrode 5 connected to a power supply $V_{CC}$ is formed on the first insulating layer 4. In this case, the above described charge storage region 3, the first insulating layer 4 and the capacitor electrode 5 constitute a capacitor cell portion of the semiconductor memory device.

A first $N^{30}$ type source/drain region 6 is formed along the upper surface of the semiconductor substrate 1, one end thereof being electrically connected to the above described charge storage region 3. In addition, a second $N^+$ type source/drain region 7 is formed opposed to the first source/drain region 6, on the semiconductor substrate 1. A third insulating layer 8 is formed on a channel region interposed between the source/drain regions 6 and 7. A gate electrode 9 serving as a word line is formed on the third insulating layer 8. The word line is shown to extend in the vertical direction in FIG. 5. The semiconductor substrate 1, the source/drain regions 6 and 7, the third insulating layer 8 and the gate electrode 9 constitute a transfer gate portion.

Furthermore, a bit line 10 extends upward from the second source/drain region 7. The bit line 10 is connected to a sense amplifier (not shown). In FIG. 5, numeral 11 denotes a $P^+$ type region for protecting the charge storage region 3, numeral 12 denotes a $P^+$ type region for protecting inversion and parasitic capacitance numeral 13 denotes an isolation insulating film for isolation formed on the $P^+$ type region 12, and numeral 27 denotes an interlayer insulating layer.

In the semiconductor memory device, the second source/drain region 7 connected to the bit line 10 is held in advance at a particular intermediate potential by a function of a sense amplifier. When a potential on the word line, i.e., of the gate electrode 9 is higher than a threshold voltage of the transfer gate, the channel region serving as an N type inversion layer is formed on the semiconductor substrate 1 immediately under the gate electrode 9. As a result, conduction between the source/drain regions 6 and 7 occurs. In this case, if and when memory information stored in a memory cell is "0", that is, electrons are stored in the charge storage region 3, conduction between the source/drain regions 6 and 7 occurs. As a result, a potential of the second source/drain region 7 which has been held so far at the intermediate potential is decreased, so that a potential on the bit line 10 is decreased. On the other hand, when memory information stored in the memory cell is "1", that is, electrons are not stored in the charge storage region 3, the potential on the second source/drain region 7 which has been held at the intermediate potential is increased. As a result, the potential on the bit line 10 is increased. The change is potential on the bit line 10 is sensed and amplified by a sense amplifier. Consequently, the memory information is extracted. At the same time, the same memory information is refreshed. The same memory information is rewritten again to the memory cell within the same cycle.

Additionally, FIG. 6 is a diagram showing the latter example, in which charges are stored in a semiconductor layer formed separated by the semiconductor substrate 1 and the insulating film. In FIG. 6, a charge storage region 14 which is an $N^+$ type semiconductor layer is formed inside the trench 2 of the semiconductor substrate 1 and on a part of the upper surface of the semiconductor substrate 1 through the insulating layer 4. The first source/drain region 6 and a charge storage region 14 are electrically connected on the upper surface of the semiconductor substrate 1. The power supply $V_{CC}$ is connected to the semiconductor substrate 1. The semiconductor substrate 1 serves as a capacitor electrode 15 in the capacitor cell portion. The other structure is the same as that of the semiconductor memory device shown in FIG. 5. The same portions have the same reference numerals and hence, descriptions thereof are omitted.

In the semiconductor memory device, charges are stored in the charge storage region 14 inside the trench 2. The stored charges are carried to the second source/drain region 7 connected to the bit line 10 through the first source/drain region 6 and the channel formed in the transfer gate portion.

Furthermore, an improved one of the above described semiconductor memory device shown in FIG. 6 is described in IEDM Technical Digest, 1984. The semiconductor memory device is referred to as an IVEC (Isolation-Merged Vertical Capacitor Cell). FIG. 7 is a cross sectional view showing main portions of the semiconductor memory device. In FIG. 7, the device comprises two capacitor cells in a single trench 2. More specifically, charge storage regions 16 which are $N^+$ type semiconductor layers are provided along the walls on both sides of the trench 2 through an insulating layer 4, respectively. A capacitor electrode 17 is formed to be interposed between the charge storage regions 16 through fourth insulating layers 18. A power supply $V_{CC}$ is connected to the capacitor electrode 17. In addition, the charge storage regions 16 are electrically connected to first source/drain regions 6 in transfer gate portions, in the upper ends of the walls on both sides of the trench 2. The charge storage regions 16 and the first source/drain regions 6 are connected to each other on the sidewalls of the trench 2 for the following reason. The area occupied by the first source/drain regions 6 in the upper surface of the semiconductor substrate 1 can be decreased, as compared with the case in which the charge storage regions 16 and the first source/drain regions 6 are connected to each other on the upper surface of the semiconductor substrate 1. As a result, a semiconductor memory device having high integration density can be obtained. In FIG. 7, numeral 19 denotes an interlayer insulating layer. The other structure is the same as that of the above described semiconductor memory device shown in FIG. 6. The same portions have the same reference numerals and hence, descriptions thereof are omitted.

In the semiconductor memory device, charges are stored in the charge storage regions 18 in the trench 2. The stored charges are carried to the second source/drain regions 7 connected to a bit line 10 through the first source/drain regions 6 and channels formed in the transfer gate portions.

Similarly, a developed one of the semiconductor memory device shown in FIG. 6 is disclosed in Japanese Patent Laying-Open Gazette No. 3260/1983. FIG. 8 is a cross sectional view showing main portions of the memory device. In FIG. 8, the device comprises a P type semiconductor substrate 1 having a trench 2 formed therein, a capacitor and a transfer gate. The capacitor comprises a charge storage layer 20, an insulating film 21 and a capacitor electrode 22 formed in the trench.

Charges stored in the charge storage layer 20 is carried to a bit line 10 through one N type source/drain region 6 connected to the charge storage layer 20, a channel formed under a gate electrode 9 and the other N type source/drain region 7.

A developed one of the semiconductor memory device shown in FIG. 6 is described in IEDM Technical Digest, 1986. The semiconductor memory device is referred to as a Dielectrically Encapsulated Trench Capacitor Cell. FIG. 9 is a cross sectional view showing main portions of the semiconductor memory device. In FIG. 9, the device comprises a P type semiconductor substrate 1 having a trench formed therein, a capacitor and a transfer gate. The capacitor includes a capacitor electrode comprising the semiconductor substrate 1 and a P+ type semiconductor layer 11 and a capacitor insulating film comprising a thin insulating film 4 interposed therebetween. An N type semiconductor layer 14 is a charge storage region.

Charges stored in the charge storage region 14 is carried to one N type source/drain region 6 through an N type semiconductor layer 30. Charges carried in the one source/drain region 6 is carried to the other source/drain region 7 through a transfer gate comprising a gate insulating film 8 and an electrode 9. The other structure is the same as that shown in FIG. 5. The same portions have the same reference numerals and hence, descriptions thereof are omitted.

However, the conventional semiconductor memory device shown in FIG. 5 has the following problems. A minority carrier in the semiconductor substrate 1 induced by alpha rays of a radioactive element included in a package or the like tends to be collected in the peripheral region of the trench 2. As a result, a potential of the charge storage region 3 is changed, so that a malfunction, that is, soft errors of the semiconductor memory device occurs. On the other hand, when the semiconductor memory device is made fine, spacing between the trench 2 and an adjacent trench is decreased.

A depletion layer provided between the charge storage region 3 on the surface of the trench 2 and the semiconductor substrate 1 expands to a depletion layer provided between a charge storage region on the surface of the adjacent trench and the semiconductor substrate 1. As a result, the depletion layers interfere with each other, so that the potential of the charge storage region 3 is changed, resulting in a malfunction.

FIG. 10 is a drawing explaining the malfunction caused by a depletion layer.

When a memory cell A is high and a memory cell B is low (electrons are charged), p-n junction between the N+ type layer 3a and P type substrate 1 is reversely biased in the memory cell at high level and a depletion layer expands toward the memory cell B. If the depletion layer of memory cell A reaches to that of memory cell B, electric field of the cell A reaches to the cell B, thereby charges stored in the cell B fled to the cell A and a state of the cell B changes from a low level to a high level. As a result, the memory cell works erroneously.

In the semiconductor memory device shown in FIG. 6, the charge storage region 14 is provided in the trench 2 of the semiconductor substrate 1. Since the charge storage region 14 is electrically isolated from the semiconductor substrate 1 through the first insulating layer 4, a potential of the charge storage region 14 is not changed by a minority carried in the semiconductor substrate 1 induced by alpha rays. As a result, the semiconductor memory device has some advantages. More specifically, soft errors can be prevented and interference between the adjacent charge storage regions 14 can be prevented. In addition, integration density of the semiconductor memory device can be increased. However, a potential of the semiconductor substrate 1, i.e., the capacitor electrode 15 is changed by charging and discharging a circuit of the semiconductor memory device, because the semiconductor substrate 1 operates as the capacitor electrode 15 in the capacitor cell portion. Thus, a potential of the charge storage region 14 is changed. As a result, the semiconductor memory device erroneously operates.

In the semiconductor memory device shown in FIG. 7, soft errors can be avoided and integration density can be increased, as in the semiconductor memory device shown in FIG. 6. The reason is that the charge storage regions 16 are isolated from the semiconductor substrate 1 through the insulating layers 4. On the other hand, the semiconductor memory device has the capacitor electrode 17 in the trench 2. Thus, even if a potential of the semiconductor substrate 1 is changed by charging and discharging the circuit, potentials of the charge storage regions 16 do not change.

FIG. 11 is a drawing showing a capacitance coupling between a bit line and a substrate.

Charges stored in a charge storage layer 4 is represented as follows.

$$Q_N = C(V_C - V_S) \tag{5}$$

where $V_C$: voltage at a capacitor electrode $V_S$: voltage at a charge storage layer. There is a large capacitance coupling between a substrate and a bit line as shown in the drawing. Therefore, when the voltage of the bit line is changed due to charging or discharging, the capacitance coupling makes the voltage of the substrate change to $V_C$. Hence a voltage of the capacitor electrode changes from a prescribed value if a memory cell has the structure shown in FIG. 11.

When a data signal is stored in the above described memory cell, charges stored change as shown in equation (5)

$$Q = C(V_C - V_S) \tag{6}$$

Q is not the same as $Q_N$. The read out data is not correct.

On the contrary, in the case of a memory cell structured as shown in FIG. 7, as the capacitor electrode is separated from the substrate by an insulating layer, the voltage of the capacitor electrode does not change. Therefore charges stored on the charge storage layer does not change and a constant read out voltage can be obtained. As a result, a malfunction of the semiconductor memory device can be prevented. However, a capacitor portion corresponding to a single memory cell is provided only on the side of one side surface of the trench 2 as a single charge storage region 16. Thus, capacitance of a capacitor is decreased. Consequently, a potential which appears on the bit line 10 is not changed so much, a malfunction of a sense amplifier is liable to occur. Furthermore, there is the following problem in the manufacturing process. It is very difficult to form three chambers in the trench 2 and form therein the charge storage regions 16 and the capacitor electrode 17 with accuracy.

In the semiconductor memory device shown in FIG. 8, the charge storage region 20 is electrically isolated from the semiconductor substrate 1 through the insulating layer 2, as in the memory device shown in FIGS. 6. Consequently, soft errors due to alpha rays can be prevented. Since interference between the adjacent charge storage regions 20 can be prevented, integration density of the semiconductor memory device is increased.

However, a contacting portion of the charge storage region 20 and the N+ impurity region 6 on the semiconductor substrate is formed on the planar surface. Thus, constant spacing is required between the transfer gate 9 and the charge storage region 20. As a result, it is difficult to increase integration density of the semiconductor memory device.

In the semiconductor memory device shown in FIG. 9, the charge storage region 4 is electrically isolated from the substrate through the insulating layer 4, as in the memory device shown in FIG. 6. As a result, the semiconductor memory device has the following advantages. More specifically, soft errors caused by alpha rays can be prevented. Since interference between the adjacent charge storage regions 4 can be prevented, integration density can be increased. P type impurities having a high concentration of the capacitor electrode 11 is interrupted by the insulating film 4, so that the impurities do not diffuse into the channel region under the transfer gate 9.

However, as in the device shown in FIG. 6, a potential of the semiconductor substrate 1, i.e., the capacitor electrode is changed by charging and discharging the circuit of the semiconductor memory device. Therefore, the amount of charges stored in the charge storage region 4 changes. As a result, the semiconductor memory device erroneously operates.

SUMMARY OF THE INVENTION

Therefore, an object of the invention is to provide a trench capacitor structure and manufacturing method therefor capable of achieving a high integration density.

Another object of the invention is to provide a trench capacitor structure wherein lateral spreading of a depletion region to adjacent capacitors is prevented.

A further object is to provide a trench capacitor structure wherein substrate potential is independent charging and discharging of the capacitor.

Another object of the invention is to provide a high integration density DRAM structure using improved trench capacitors.

A further object is to reduce the effect of soft errors in a DRAM by providing an improved trench capacitor therein.

The above described objects of the present invention can be achieved if a capacitor cell of the semiconductor memory device is formed in a trench of the semiconductor substrate.

Briefly stated, the semiconductor memory device according to the present invention comprises a semiconductor substrate having a trench, a charge storage region formed through an insulating film on an inner portion of the trench, and a capacitor electrode layer formed through the insulating film on the inner peripheral surface of the charge storage region.

Since the semiconductor memory device according to the present invention has the above described structure, capacitance of a capacitor can be sufficiently ensured even if integration density of the semiconductor memory device is increased. In addition, since the semiconductor substrate does not serve as a capacitor electrode, no malfunction caused by charging and discharging the circuit occurs.

In accordance with a preferred embodiment, a method for manufacturing the semiconductor memory device comprises the steps of preparing a semiconductor substrate of a first conductivity type having a trench, forming a first insulating layer in an inner portion of the trench, forming a polysilicon layer of a second conductivity type serving as a charge storage region along the inner peripheral surface and the bottom surface of the first insulating layer, forming a second insulating layer along the inner surface of the polysilicon layer of the second conductivity type, and forming a polysilicon layer of the second conductivity type serving as a capacitor electrode in an inner portion of a trench formed by the second insulating layer and the first insulating layer.

Since the method for manufacturing the semiconductor memory device comprises the foregoing steps, the manufacturing process of the semiconductor memory device can be simplified.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
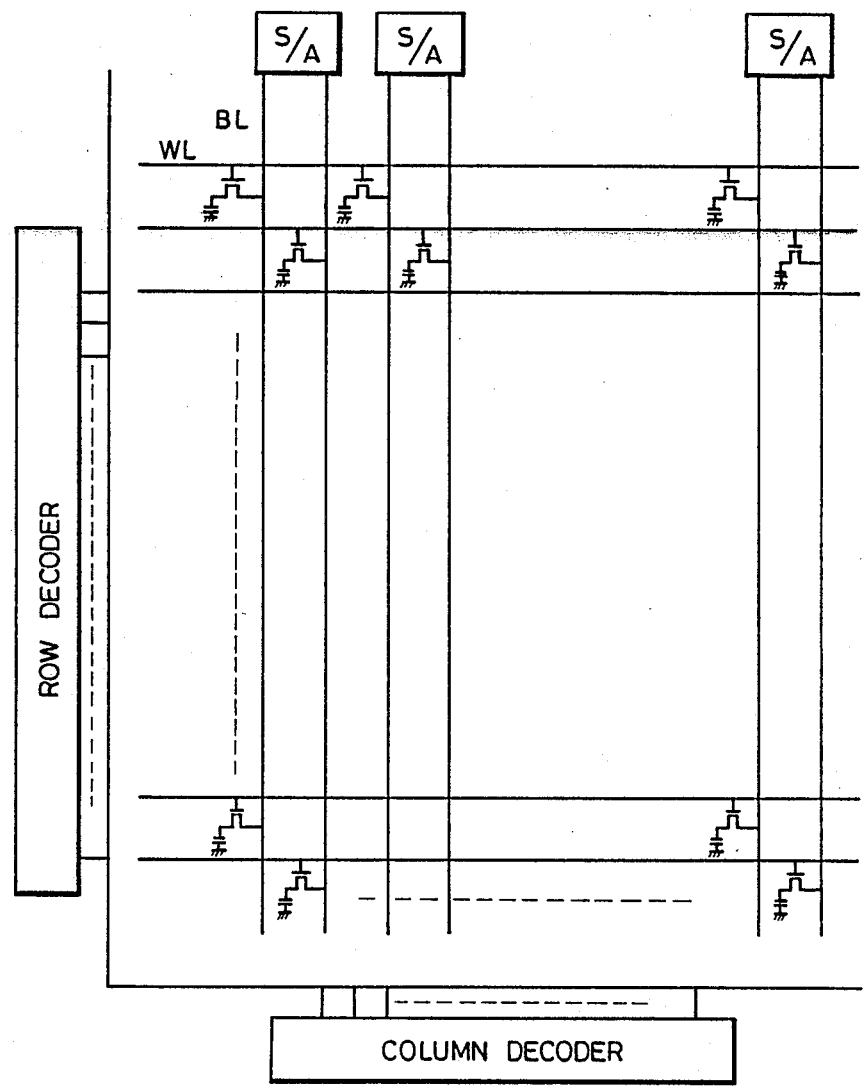
FIG. 1 is a block diagram showing an entire structure of a conventional dynamic semiconductor memory device.
Figure 2:
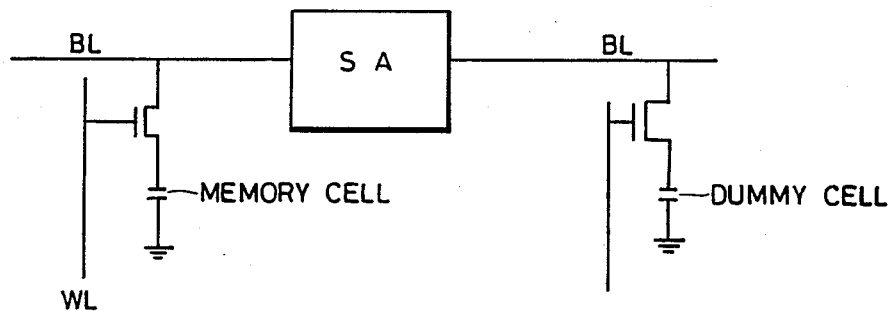
FIG. 2 is a schematic diagram showing a periphery of a sense amplifier.
Figure 3:
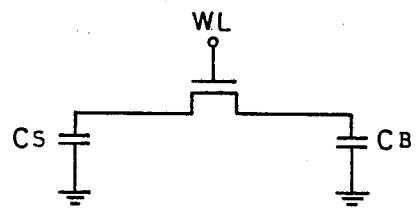
FIG. 3 is an equivalent circuit explaining a voltage difference to be sensed by a sense amplifier.
Figure 4:
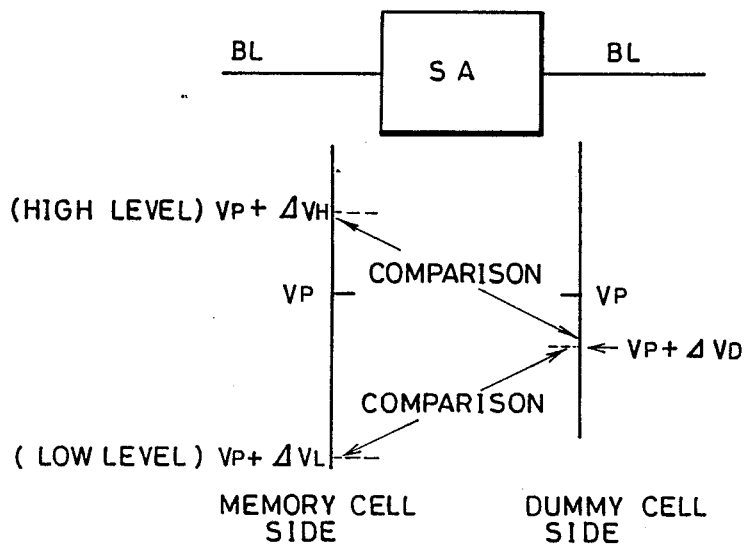
FIG. 4 is a schematic diagram showing a relationship between high level, low level and prescribed midway value of the dummy cell.
Figure 5:
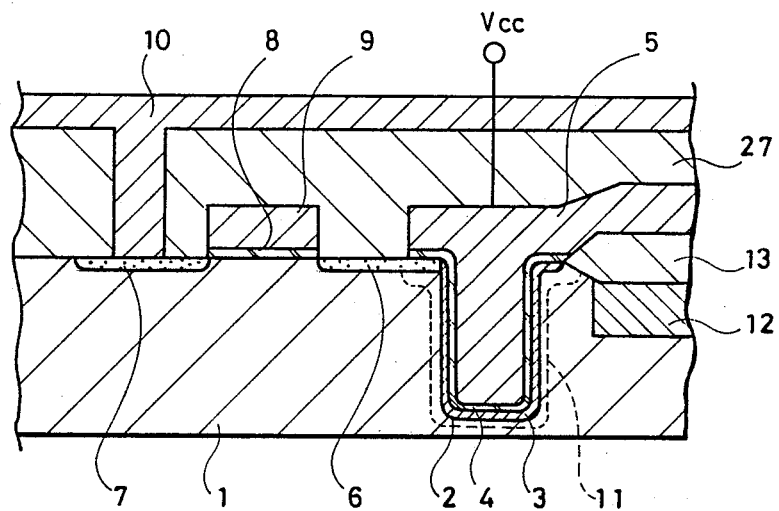
FIGS. 5 to 9 are diagrams showing structures of the conventional dynamic semiconductor memory device.
Figure 6:
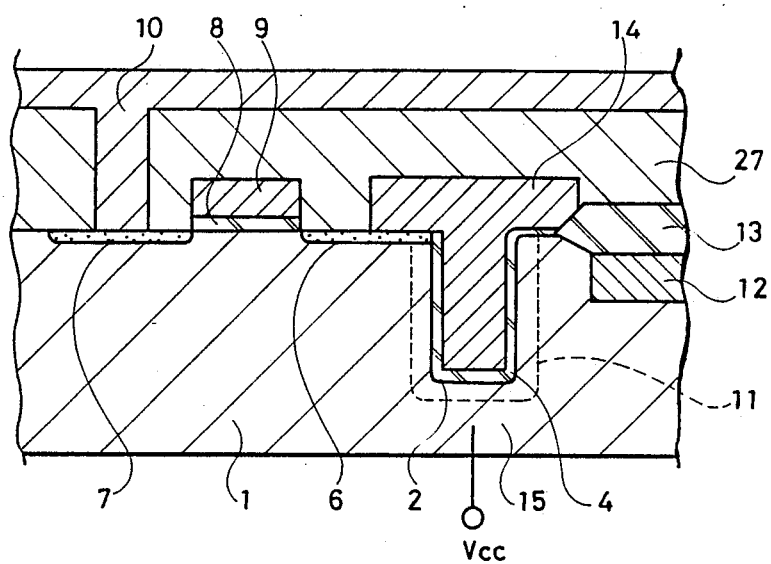
Figure 7:
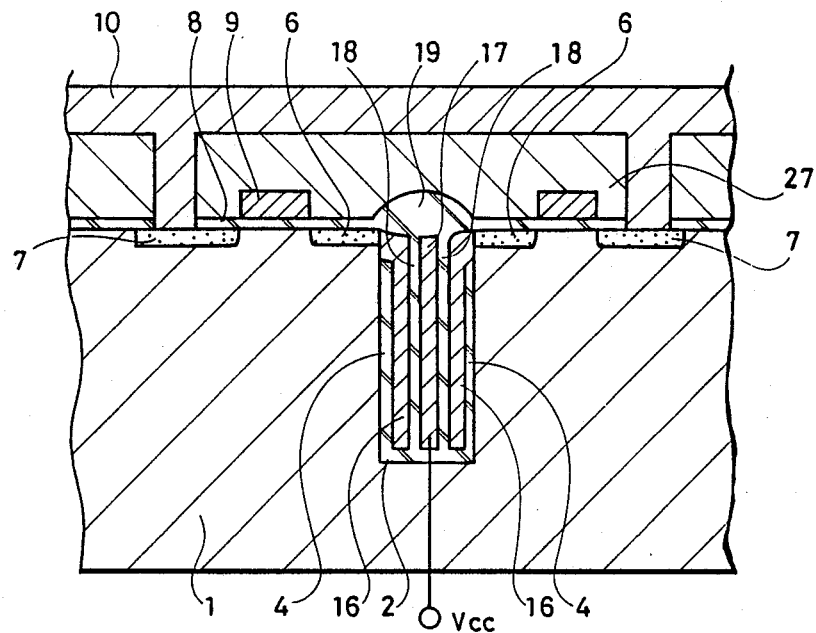
Figure 8:
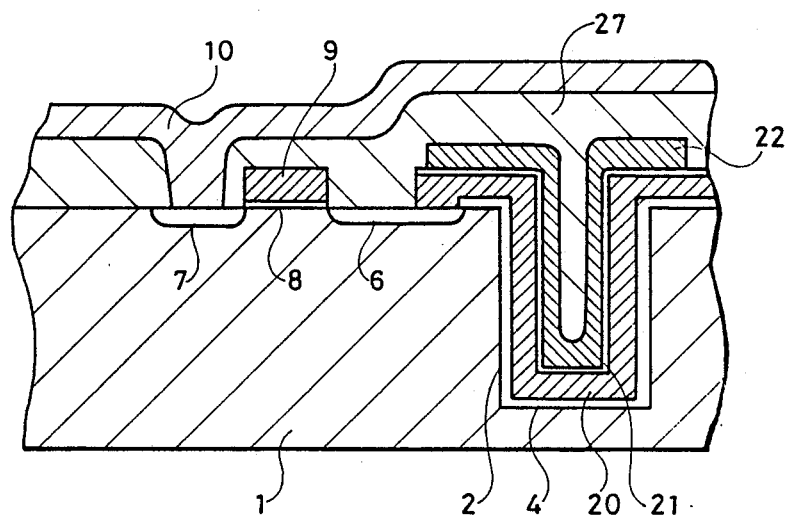
Figure 9:
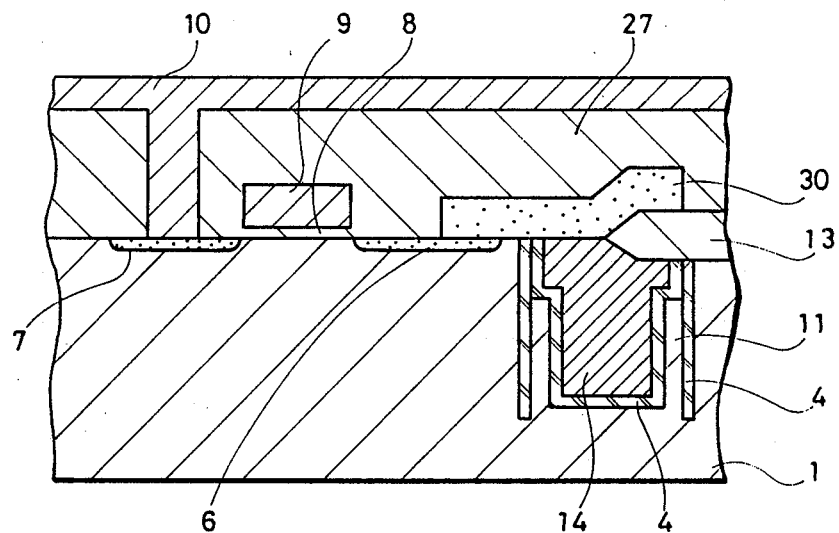
Figure 10:
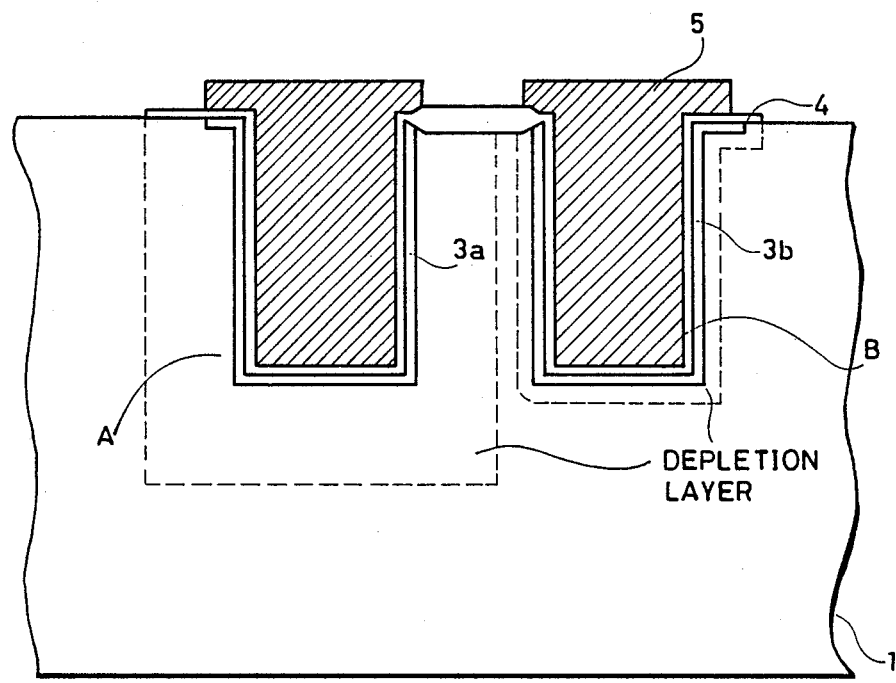
FIG. 10 is a drawing explaining a malfunction caused by a depletion layer.
Figure 11:
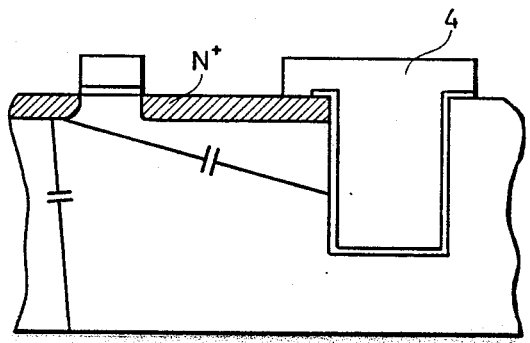
FIG. 11 is a drawing showing a capacitance coupling between a bit line and a substrate.

Referring now to the drawings, an embodiment of the present invention is described.

Figure 12A:
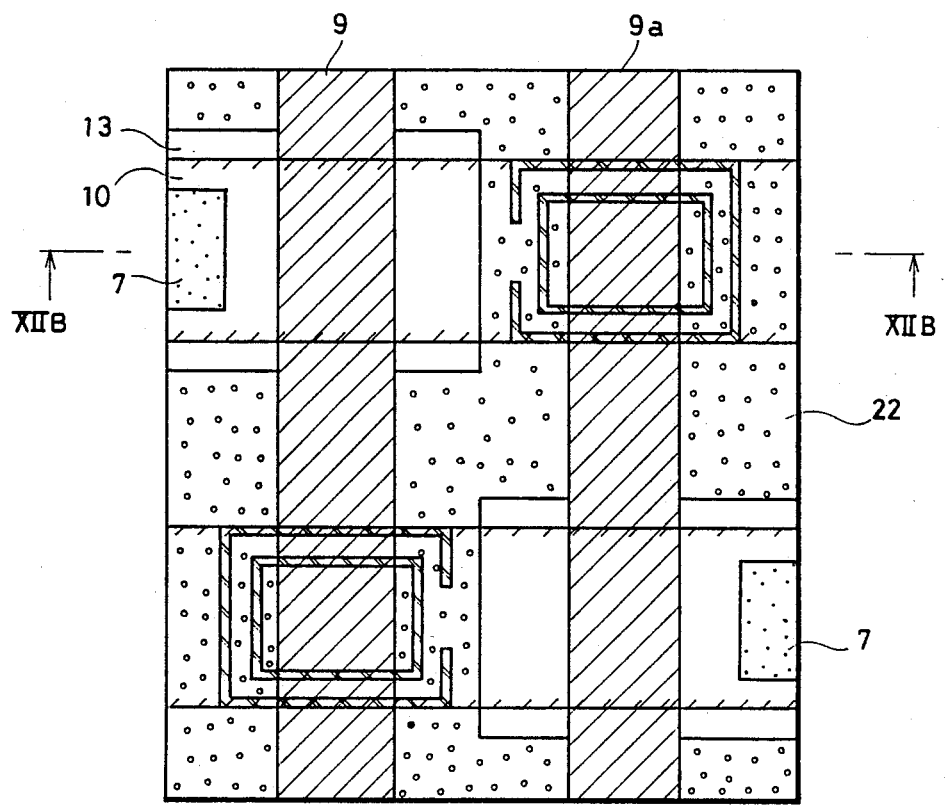
FIG. 12A is a plan view of a semiconductor memory device according to the present invention.
Figure 12B:
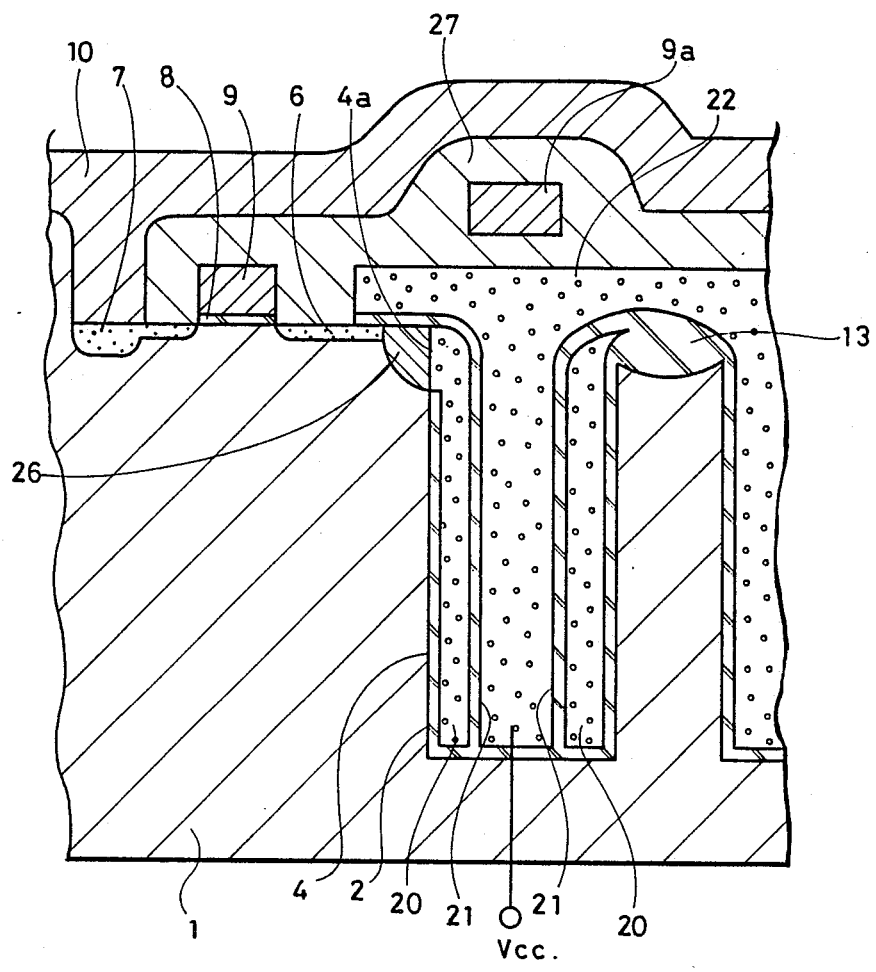
FIG. 12B is a cross sectional view of a portion taken along a line XIIB—XIIB shown in FIG. 12A.

FIG. 12A is a plan view of a semiconductor memory device using a capacitor cell according to an embodiment of the present invention. FIG. 12B is a cross sectional view taken along a line XIIB—XIIB shown in FIG. 12A. Referring to FIGS. 12A and 12B, a first insulating layer 4 is formed in an inner portion of a trench 2 of a semiconductor substrate 1 of a first conductivity type. In addition, a storage region 20 which comprises a polysilicon layer of a second conductivity type are formed along the inner peripheral surface of the first insulating layer 4. Furthermore, a second insulating layer 21 is formed along the inner peripheral surfaces of the charge storage regions 20. Furthermore, a capacitor electrode 22 comprising polysilicon of the second conductivity type is formed in the inner peripheral surface of the insulating layers 21. The capacitor electrode 22 is connected to a power supply $V_{CC}$. An opening 4a is formed in the first insulating layer 4 in the upper end of one sidewall of the trench 2. The charge storage region 20 is electrically connected to a first source/drain region 6 through an impurity layer 26 utilizing the opening 4a. In this case, the first insulating layer 4, the charge storage regions 20, the second insulating layer 21 and the capacitor electrode 22 constitute a capacitor cell portion. In FIG. 12B, numeral 9a denotes a word line extending in the vertical direction in FIG. 12B. Since the other structure as the same as those of the conventional examples shown in FIGS. 5 to 9, the same portions have the same or corresponding reference numerals and hence, the descriptions thereof are omitted.

In the semiconductor memory device, charges are stored in the charge storage region 20 provided on the entire sidewall of the trench 2. The stored charges are carried to a second source/drain region 7 connected to a bit line 10 through the impurity layer 26, the first source/drain region 6 and a channel formed in a transfer gate portion.

Figure 13:
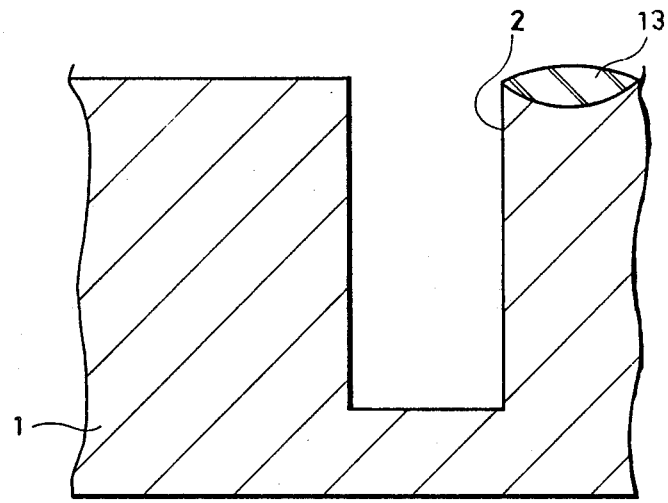
FIG. 13 to 22 are diagrams showing the steps of a method for manufacturing the semiconductor memory device according to the present invention.
Figure 14:
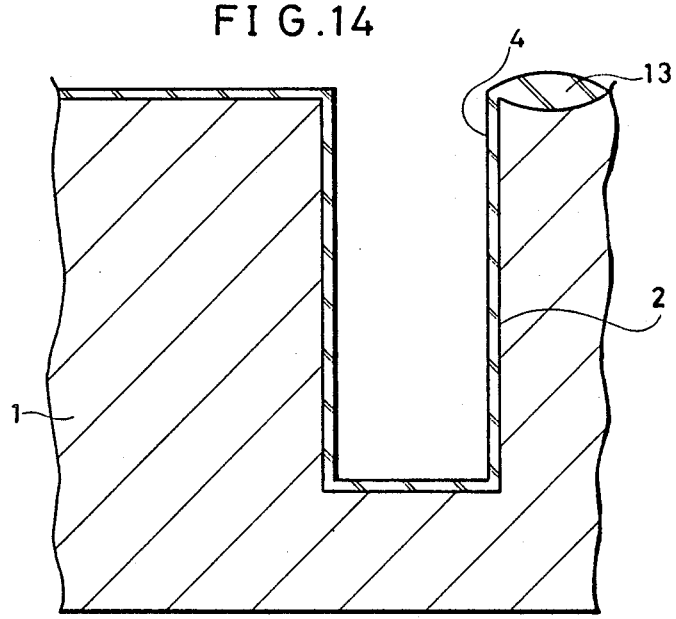
Figure 15:
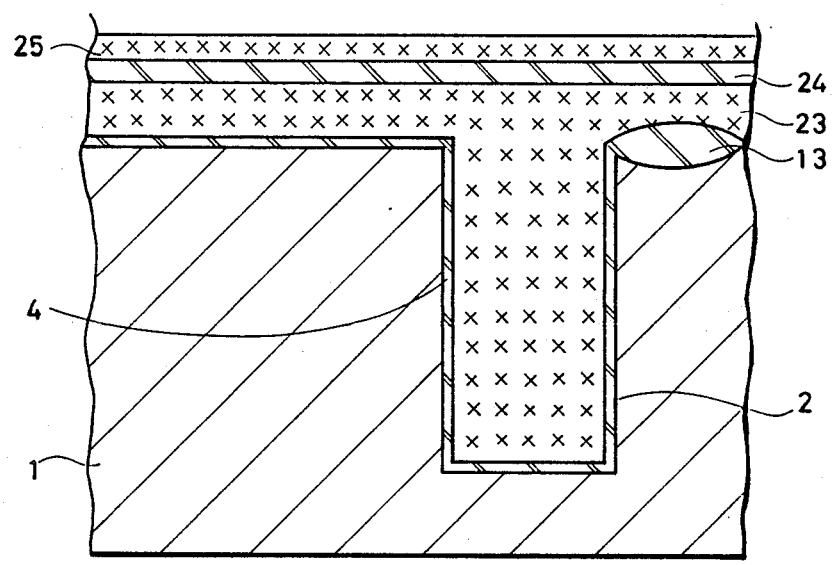

Description is now made on a method for manufacturing the semiconductor memory device. In FIG. 13, an isolation insulating film 13 for isolation is formed on a semiconductor substrate 1 of the first conductivity type. The trench 2 is then formed. In FIG. 14, the first insulating layer 4 is formed on the whole of the inner portion of the trench 2 and on the upper surface of the semiconductor substrate 1. Then, in FIG. 15, a first resist 23 is applied on the entire first insulating layer 4. Silicon oxide 24 melted in an organic solvent is applied on the resist 23. The silicon oxide 24 is baked and solidified. A second resist 25 is applied on the silicon oxide 24. A portion to be removed, of the second resist 25 is sensitized by an exposing apparatus. After development, a pattern of the second resist 25 is formed. The portion to be removed, of the second resist 25 is formed in accordance with the pattern. The second resist 25 is utilized as a mask so that the silicon oxide 24 is etched.

Figure 16:
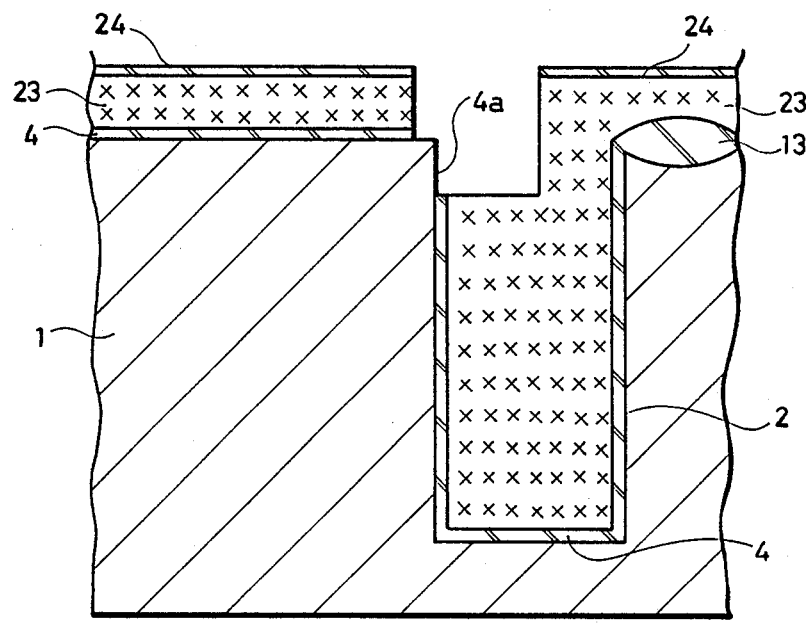
Figure 17:
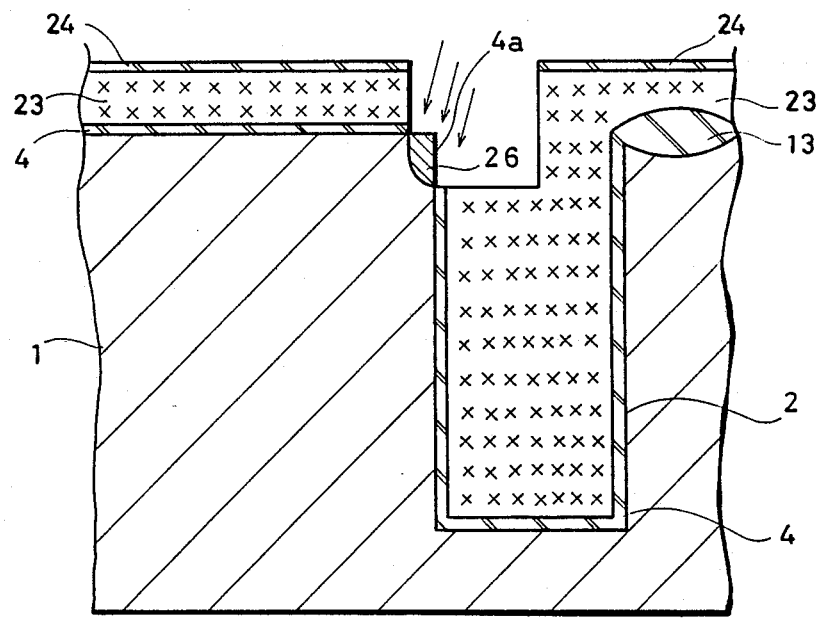

Then, in FIG. 16, the first 23 is anisotropically etched utilizing the silicon oxide 24 as a mask. The etching is stopped in the position having a desired depth. The above method is a pattern forming process referred to as a so-called three-layer resist process. The first insulating layer 4 in the upper end of the sidewall of the trench 2 and the first insulating layer 4 on a part of the upper surface of the semiconductor substrate 1 are removed utilizing the first resist 23 as a mask. An opening 4a is formed. Then, in FIG. 17, ions ($1 \times 10^{15}/cm^2 \sim 1 \times 10^{16}/cm^2$) are implanted from the opening 4a to the semiconductor substrate 1 from an oblique angle as represented by arrows, so that an impurity layer 26 of the second conductivity type whose concentration is more than $10^{20}/cm^3$ is formed.

Figure 18:
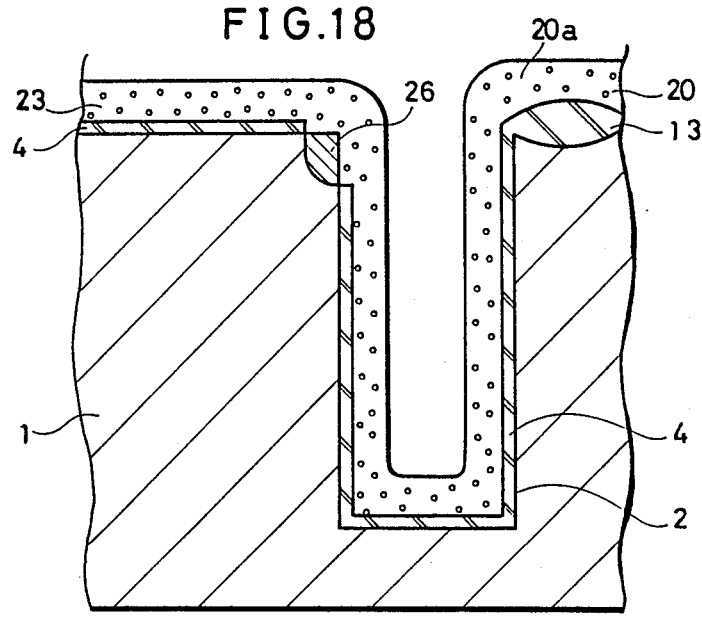
Figure 19:
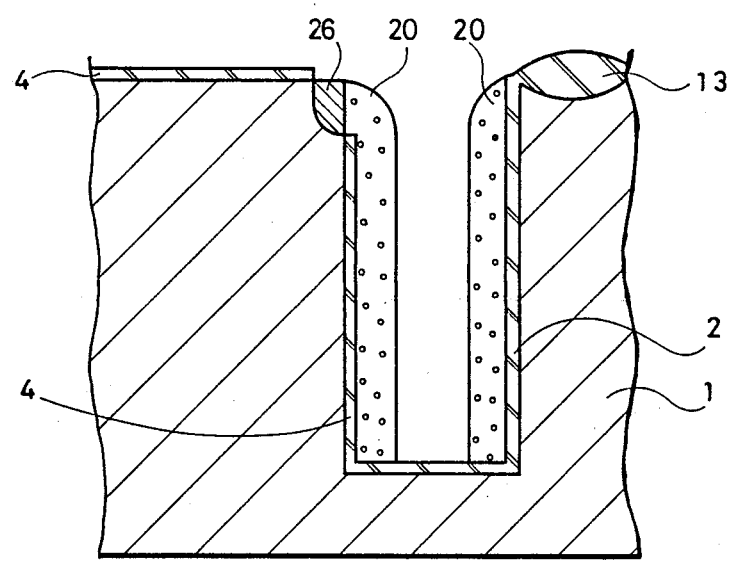

The first resist 23 and the silicon oxide 24 are then removed. In FIG. 18, a polysilicon layer 20a of the second conductivity type whose concentration is roughly $1 \times 10^{19}/cm^3 \sim 1 \times 10^{22}/cm^3$ is deposited from the inner peripheral surface of the trench 2 to the upper surface of the semiconductor substrate 1 by a chemical vapor disposition (CVD) process. The polysilicon layer 20a located on the upper surface of the semiconductor substrate 1 and the polysilicon layer at the bottom surface of the trench 2 is then removed by anisotropic etching using self-alignment by the sidewall. In FIG. 19, the charge storage regions 20 are formed into a shape as shown in FIG. 12A along the inner peripheral surface of the first insulating layer 4.

Figure 20:
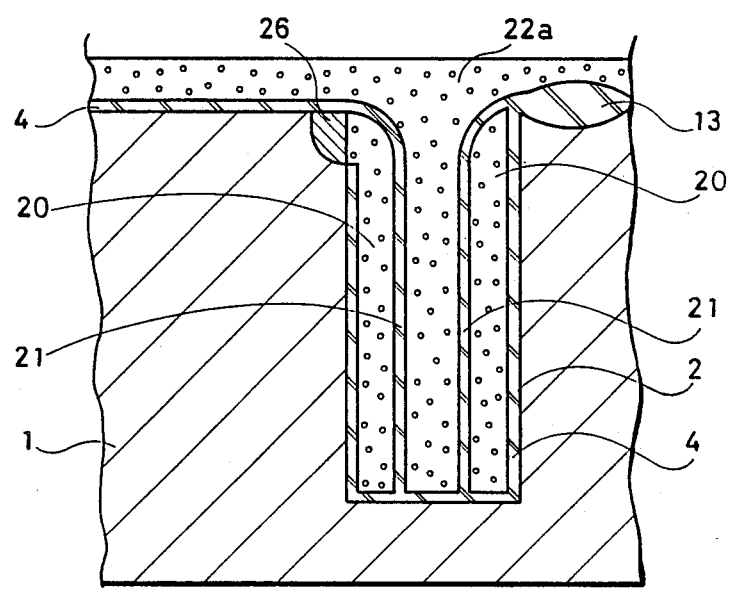
Figure 21:
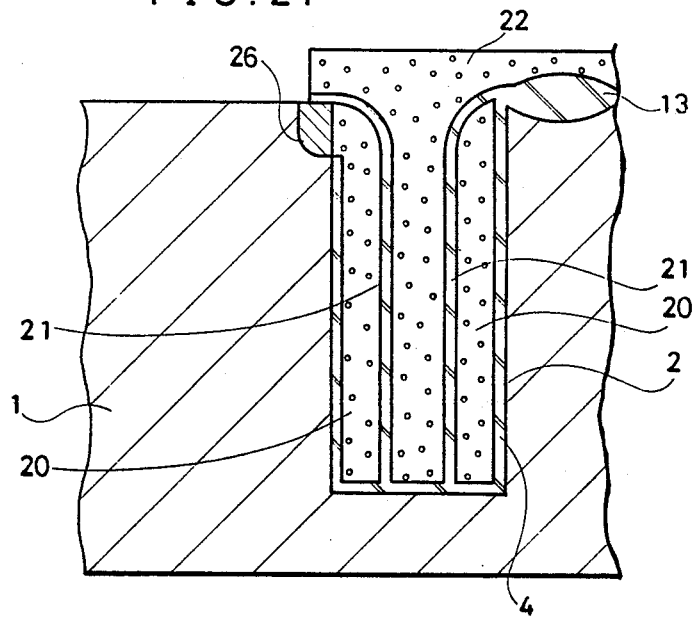

Then, in FIG. 20, a second insulating layer 21 of silicon nitride, silicon oxide or their composite layer is formed along the inner peripheral surfaces of the charge storage region 20. The thickness of the second insulating layer 21 is about $50 \sim 500 \text{Å}$. In addition, a polysilicon layer 22a whose thickness is $1000 \text{Å} \sim 5000 \text{Å}$ and concentration is $1 \times 10^{19}/cm^3 \sim 1 \times 10^{22}/cm^3$ is formed inside of the second insulating layer 21 and on the upper surface of the semiconductor substrate 1 by the CVD process. In FIG. 21, the polysilicon layer 22a on the upper surface of the semiconductor substrate 1 and the insulating layer 4 located thereunder are removed. A capacitor electrode 22 is formed on the polysilicon layer 22a.

Figure 22:
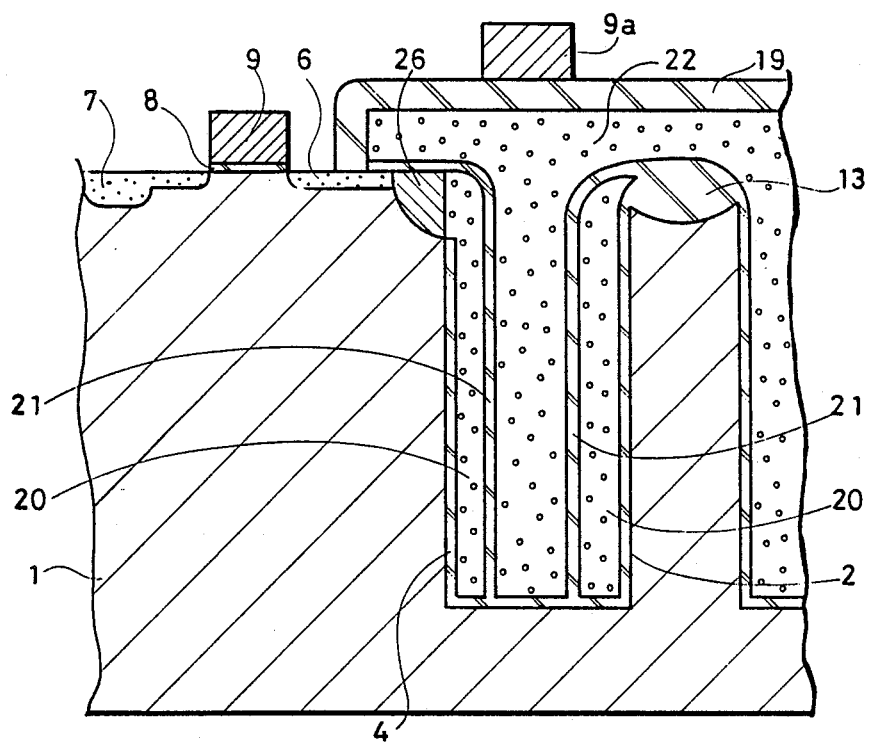

Then, in FIG. 22, a third insulating layer 8 a thickness of which is $50 \sim 250 \text{Å}$ and an interlayer insulating layer 19 are formed. Polysilicon layers of the second conductivity type are also deposited thereon by the CVD process. Patterns of a gate electrode 9 and a word line 9a are formed. In order to form a first source/drain region 6 and a second source/drain region 7, impurities of the second conductivity type are then ion-implanted at the rate of $1 \times 10^{15}/cm^2 \sim 1 \times 10^{16}/cm^2$ into a predetermined region of the semiconductor substrate 1. In this case, the first source/drain region 6 and the charge storage region 20 are electrically connected through the impurity layer 26.

Thereafter, an interlayer insulating layer 27 is formed, as shown in FIG. 12B. In addition, a contact hole and the bit line 10 are formed on the second source/drain region 7.

According to the semiconductor memory device, since the charge storage region 20 is formed in an inner portion of the trench 2, capacitance of a capacitor can be sufficiently ensured. Since the charge storage region 20 is provided on the inner surface of the trench 2 of the semiconductor substrate 1 through the first insulating layer 4, potentials of the charge storage region 20 is not changed by a minority carrier of the semiconductor substrate 1 induced by alpha rays. As a result, soft errors can be avoided. Interference does not occur even if the trenches 2 are formed close to each other. As a result, integration density of the semiconductor memory device can be increased. The capacitor electrode 22 is provided in the trench 2 through the first and second insulating layers 4 and 21. Therefore, even if the potential of the semiconductor substrate 1 is changed by charging or discharging to or from a circuit, the potential of the charge storage region 20 does not change. As a result, a malfunction of the semiconductor device is prevented. In addition, since layers constituting the capacitor cell are arranged in the order from the inner peripheral surface of the trench 2 to the central portion thereof, the manufacturing process device can be simplified.

The opening 4a is formed in the first insulating layer 4 in the upper end of the sidewall of the trench 2 using the three-layer resist process. The charge storage region 20 is formed by self-alignment by anisotropic etching without using a mask or the like. As a result the semiconductor memory device is manufactured by a simple manufacturing process.

As described in the foregoing, the semiconductor memory device according to the present invention comprises a semiconductor substrate having a trench, a charge storage region formed through a first insulating layer on an inner portion of the trench, and a capacitor electrode layer formed on inner peripheral surfaces of the charge storage region through second insulating layers. As a result, capacitance of a capacitor cell can be sufficiently ensured, so that soft errors can be avoided, a malfunction caused by charging or discharging to or from the circuit can be removed, integration density can be increased and the manufacturing process can be simplified.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a semiconductor substrate having a major surface having a predetermined impurity concentration of a first conductivity type and having a trench formed for forming capacitance for storing information charges,
   a first insulating layer formed on opposite side walls of said trench,
   a first contiguous conductive layer of a second conductivity type formed along and in contact with sidewall portions of said first insulating layer on said opposite side walls of said trench,
   a second insulating layer formed along and in contact with the sidewall portions of said first conductive layer of the second conductivity type, and
   a second conductive layer of the second conductivity type formed in an inner portion of a trench formed by said second insulating layer and said first insulating layer.

2. A semiconductor memory device according to claim 1, wherein said first conductive layer of the second conductivity type, said second insulating layer and said second conductive layer of the second conductivity type constitute a capacitor cell, said first conductive layer of the second conductivity type being charge storage region.

3. A semiconductor memory device according to claim 2, which further comprises
   first and second semiconductor regions of the second conductivity type formed space apart from each other on the major surface of said semiconductor substrate adjacent to said trench, and
   a third conductive layer formed through an insulating film on a portion interposed between said first and second semiconductor regions,
   said first and second semiconductor regions of the second conductivity type and said third conductive layer constituting a field effect element.

4. A semiconductor memory device according to claim 3, wherein said field effect element comprises a field effect transistor.

5. A semiconductor memory device according to claim 4, wherein said first conductive layer of the second conductivity type is electrically connected to either of said first and second semiconductor regions of the second conductivity type in an upper end portion of said trench.

6. A semiconductor memory device comprising:
   a semiconductor substrate having a major surface having a predetermined impurity concentration of a first conductivity type; and
   a memory cell having
      (a) a trench having opposed side walls and opposed end walls formed in said substrate,
      (b) a capacitor cell including
         (i) an insulating layer formed in said trench on said opposed side walls and end walls of said trench, said first insulating layer having an opening at an upper portion thereof on one of said side walls of said trench,
         (ii) a first contiguous conductive layer of a second conductivity type formed in said trench on said first insulating layer formed on said side and end walls of said trench,
         (iii) a second insulating layer formed in said trench, on and covering said first conductive layer, and
         (iv) a second conductive layer of the second conductivity type formed in a inner portion of a trench formed by said second insulating layer and said first insulating layer, and
      (c) a first impurity contact region formed in said major surface of said substrate adjacent to said trench at an upper portion thereof, said contact impurity region in electrical contact with said first conductive layer of said trench through said opening in said first insulating layer of said trench; and
      (d) a field effect transistor including
         (i) first and second semiconductor regions of the second conductivity type formed spaced apart from each other on the major surface of said semiconductor substrate adjacent to said trench, said first semiconductor region adjacent to, and in electrical contact with, said impurity contact region; and
         (ii) a gate electrode formed through an insulating film on a portion interposed between said first and second semiconductor regions.

* * * * *